United States Patent [19]
Hebing et al.

[11] Patent Number: 5,933,003
[45] Date of Patent: Aug. 3, 1999

[54] MAGNETORESISTIVE WHEATSTONE BRIDGE WITH COMPENSATING CURRENT CONDUCTOR FOR MEASURING AN ELECTRIC CURRENT

[75] Inventors: Ludger Hebing, Asslar; Juergen Kunze, Wetzlar; Karl-Heinz Lust, Lahnau, all of Germany

[73] Assignee: Lust Antriebstechnik GmbH, Lahnau, Germany

[21] Appl. No.: 08/817,008

[22] PCT Filed: Sep. 25, 1995

[86] PCT No.: PCT/EP95/03781

§ 371 Date: Mar. 26, 1997

§ 102(e) Date: Mar. 26, 1997

[87] PCT Pub. No.: WO96/10186

PCT Pub. Date: Apr. 4, 1996

[30] Foreign Application Priority Data

Sep. 26, 1994 [DE] Germany ............... 44 34 417

[51] Int. Cl.⁶ .............. G01R 19/00; G01R 17/10; G01R 33/025; G01R 33/09
[52] U.S. Cl. ............ 324/117 R; 324/99; 324/126; 324/252
[58] Field of Search ............ 324/98, 99, 117 R, 324/117 H, 126, 127, 252

[56] References Cited

U.S. PATENT DOCUMENTS

| | | | |
|---|---|---|---|
| 4,525,668 | 6/1985 | Lienhard et al. | 324/117 R |
| 4,596,950 | 6/1986 | Lienhard et al. | 324/117 R |
| 5,621,377 | 4/1997 | Dettmann et al. | 324/252 X |
| 5,767,668 | 6/1998 | Durand | 324/117 R |

OTHER PUBLICATIONS

Rühl et al; "Stromsensor als Microsystem", Electronic vol. 42, No. 5, Oct. 1993 Munchen, DE, pp. 42–44.

*Primary Examiner*—Gerard Strecker
*Attorney, Agent, or Firm*—Flynn, Thiel, Boutell & Tanis, P.C.

[57] ABSTRACT

Measuring devices for determining magnetic fields to be used in particular for the potential-free measurement of the strength of an electric current which generates such a magnetic field. To obviate the need for an intermediate element specially connected into the relevant current conductor and to allow the measurement device instead to be accommodated in a clamp device which needs only to be slipped over the current conductor, the proposed embodiment has two measuring bridges which are fixed on either side of the current conductor, the staggering of the two bridges is assessed from the current magnetic field via a control circuit.

22 Claims, 5 Drawing Sheets

MAGNETORESISTIVE WHEATSTONE BRIDGE WITH COMPENSATING CURRENT CONDUCTOR FOR MEASURING AN ELECTRIC CURRENT

BACKGROUND OF THE INVENTION

The invention relates to a device for measuring an electric current flowing through a current conductor with an electric control circuit comprising a measuring component in the form of a measuring bridge of magnetoresistive measuring resistors. This type of measuring bridge is constructed as a Wheatstone bridge, to which is applied an electric bridge voltage and from which is tapped a measuring voltage for measuring the strength of a magnetic field produced by the current in the vicinity of the current conductor. The measuring voltage of the measuring bridge controls a compensating current that flows in a compensating conductor, which is selected such that the magnetic field strength of the compensative current measured by a measuring component is so that the compensating current is proportional to the current.

A measuring device for determining magnetic field strength is employed to facilitate the potential-free measurement of the current strength of the electric current, which generates the magnetic field. Since in the vicinity of a magnetic field that is measured in this manner there is already large-area interference magnetic fields, it is obvious to differentiate the interfering field with the help of magnetic field gradients between the magnetic field to be measured and the interference magnetic field.

Such a measuring device is known from the Offenlegungsschrift DE 43 00 605, also published as U.S. Pat. No. 5,621,377, in which a sensor, which is equipped with a measuring bridge of magnetoresistive laminated strips and a thin laminated microstrip that functions as a conductor for the compensating current are structurally provided. The output signal is independent from the interference field, is proportional to the current being measured and is neither temperature nor auxiliary magnetic field dependent. However, in the prior art it is necessary that the measuring device be provided with an intermediate element integral with the current conductor. Thus, the current conductor must for this purpose be cut and must be connected on both sides of the intermediate element, if one wants to avoid expressing a portion of the current conductor in order to be able to mount the measuring device. When measuring large currents a busbar alone is practical as the intermediate element, on which the measuring device has already been mounted and calibrated, in order to be able to control the influence of the geometric dimensions on the turns ratio.

SUMMARY OF THE INVENTION

The basic purpose of the invention is therefore to overcome these disadvantages and to construct a measuring device of the type identified in detail in the beginning such that it can be connected at any time to the current conductor, which remains unchanged, and can, if needed, also be easily again removed without that the advantages already realizable in such measuring devices—potential-free, interference-field independent, temperature independent and auxiliary magnetic field independent measuring—would have to be abandoned.

The measuring device of this invention includes two parallel connected measuring bridges or measuring bridge halves that are subjected to the electric bridge voltage so as to function as a measuring component. The measuring bridges each consist of four magnetoresistive measuring resistors arranged in a measuring bridge. A measuring bridge half consists of two magnetoresistive resistors and the measuring resistors in the measuring bridges or measuring bridge halves are arranged in one common bridge plane. Each measuring bridge or measuring bridge half has a compensating line, and the sum of the compensating currents through the compensating lines of the measuring bridges or measuring bridge halves is proportional to the flowing current.

The invention takes advantage of the fact that on both sides of a current conductor the magnetic field produced along the conductor acts in opposite direction and is either strengthened or weakened in a homogeneous interference field so that these interference field dependent components continue to be eliminated through addition in the measuring device. However, it is thereby also possible that each one measuring bridge together with the associated compensating line can be housed in a sensor, and that the two sensors can be provided in a one common clamping device. This device is placed as a measuring component around the current conductor. Such a design separate from the current conductor could up to now not be disclosed in the measuring device mentioned in the beginning with the means of the state of the art.

It is particularly advantageous when the conductors through which the compensation currents flow are connected to the associated measuring bridges through differential amplifiers to which on the other side the measuring voltage of this measuring bridge is applied so that from the sum of the compensating currents can be formed a measuring signal, which is processed in a suitable manner such that it is proportional to the current strength in the current line.

A particularly advantageous design provides that the measuring bridges are provided above and below the current conductor, whereby it is best from a structural point of view when the measuring bridges are arranged horizontally and each with respect to a common vertical axis of symmetry centrally; the current conductor can thereby be moved horizontally and parallel to its longitudinal axis without that a significant error in measuring occurs as long as the cross section of the current conductor is rather wide than high. Alternatively, it is also possible that the measuring bridges and the current conductor continue to be aligned horizontally. The measuring bridges in this configuration are located to the right and left of the longitudinal axis of the current conductor and ideally, are spaced at equal distance from the current conductor. The current conductor in this configuration can be moved horizontally and parallel to its longitudinal axis to a large extent without an intolerable measuring error occurring. This is because while the measuring signals of the measuring bridges are reduced and increased their sum remains unchanged.

The measuring device of the invention can also be used in the same manner without significant measuring errors when the distances of the longitudinal axis of the current conductor from the bridge planes of the measuring bridges are not the same. The deviation can differ up to 15%, whereby the measuring error does not exceed 5%. The two measuring bridges are advantageously arranged at a defined distance. The electric conductor provided between these can then be moved in a wide range without that the sum of the two compensating currents changes significantly. The necessary exactness during the installation of the conductor is thus reduced, namely even deviations from the desired position hardly influence the measuring result.

BRIEF DESCRIPTION OF THE DRAWINGS

The invention will be discussed in greater detail hereinafter in connection with one exemplary embodiment and the drawings, in which.

DETAILED DESCRIPTION

Figure 1:
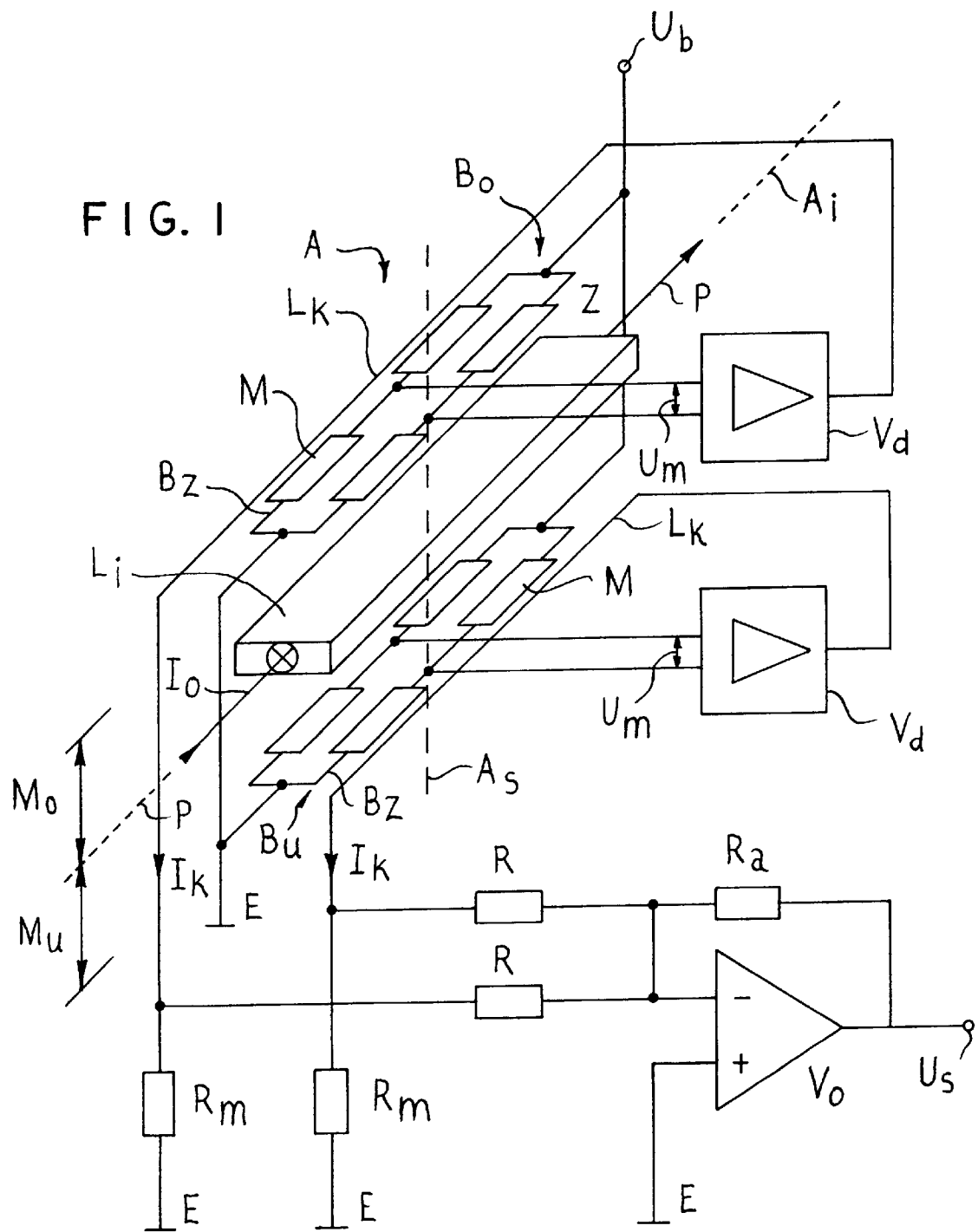
FIG. 1 shows a schematic circuit diagram of the measuring device of the invention, partially in a three-dimensional illustration.

As depicted in FIG. 1, a busbar, which serves as a current conductor Li and through which flows a current Io to be measured, is part of an electrical performance circuit; the drawing shows a short, horizontal part of such a busbar. The direction of the current Io is indicated by direction arrows P.

Measuring bridges Bo, Bu are mounted in a suitable manner at the distance Mo, Mu, respectively above and below the current conductor Li, longitudinal axis Ai, and along a common lateral axis of symmetry As, stationary with respect to said current conductor. The measuring bridges each consist of four magnetoresistive measuring resistors M connected like a Wheatstone bridge to which a bridge voltage Ub is applied. The bridges of the measuring device are formed together with compensating lines Lk so as to form a measuring component A.

A measuring voltage Um is tapped from each measuring bridge Bo, Bu and is fed to a differential amplifier Vd. Differential amplifier Vd regulates the compensating current Ik in each compensating conductor Lk in such a manner that the measuring voltage Um is driven to zero.

A measuring resistor Rm is connected between each compensating conductor Lk and ground E. The voltage drops across resistors Rm are measured. These voltages are applied through resistors R to the inverting input of an operational amplifier Vo. The non-inverting input of operational amplifier Vo is tied to ground E. Resistor Ra provides feedback between the output and inverting input of operational amplifier Vo. The output voltage Us of the operational amplifier Vo is proportional to the current Io to be measured.

Figure 2:
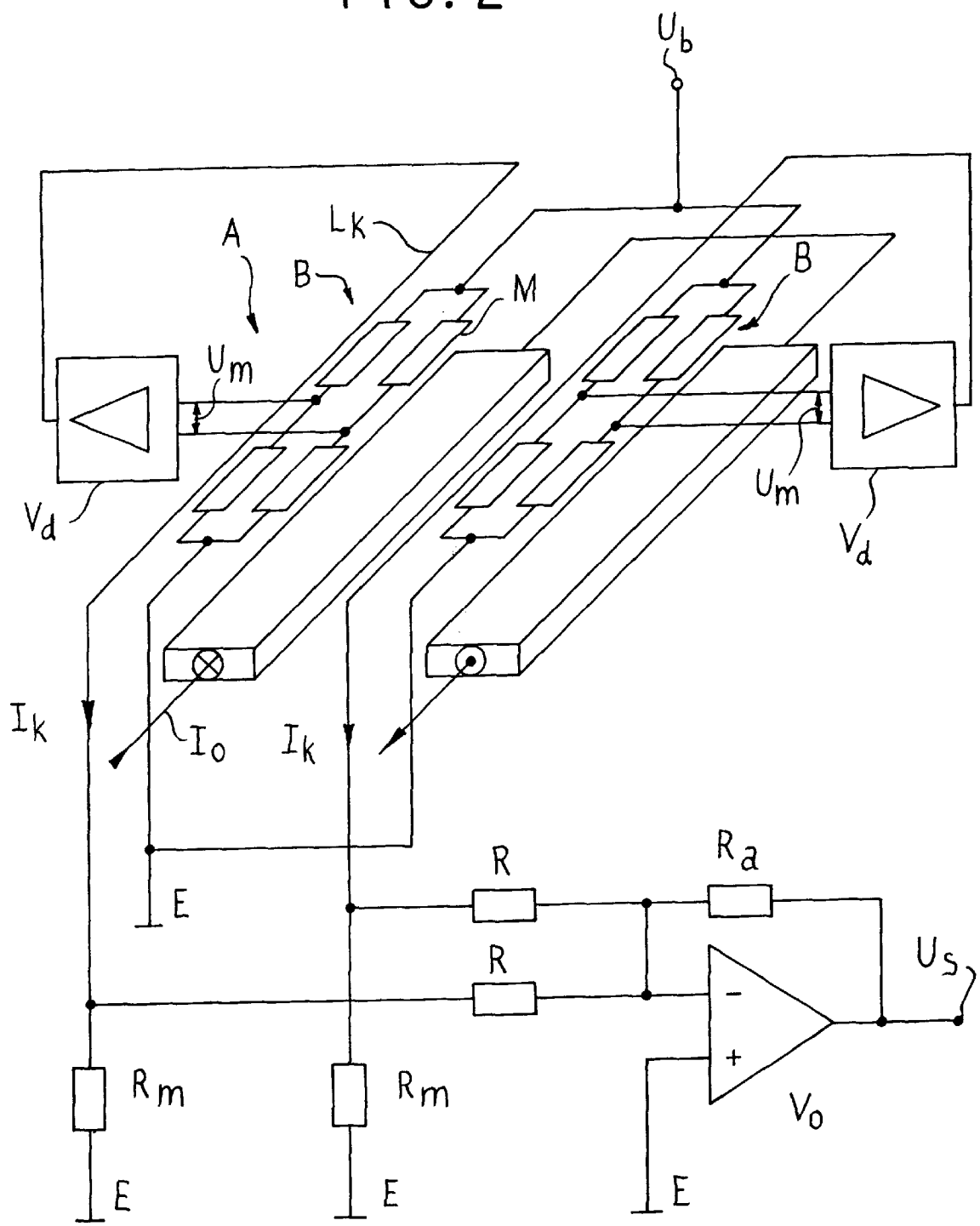
FIG. 2 shows a circuit diagram according to FIG. 1, however, the measuring bridges are arranged in one common plane, which lies parallel to and above the surface spanned by the current loop.

The significant difference between the embodiment according to FIG. 2 and the one of FIG. 1 is that the two measuring bridges are arranged in a common plane, which lies parallel to and above the surface spanned by parallel current conductors Li through which the current to be measured flows in opposite directions. This circuit is also insensitive to homogeneous interference fields. The insensitivity to movement of the measuring bridges relative to the axes of the current conductor no longer exists here. The advantage of this circuit is that the sensors may be arranged only on one side of the current conductor.

Figure 3:
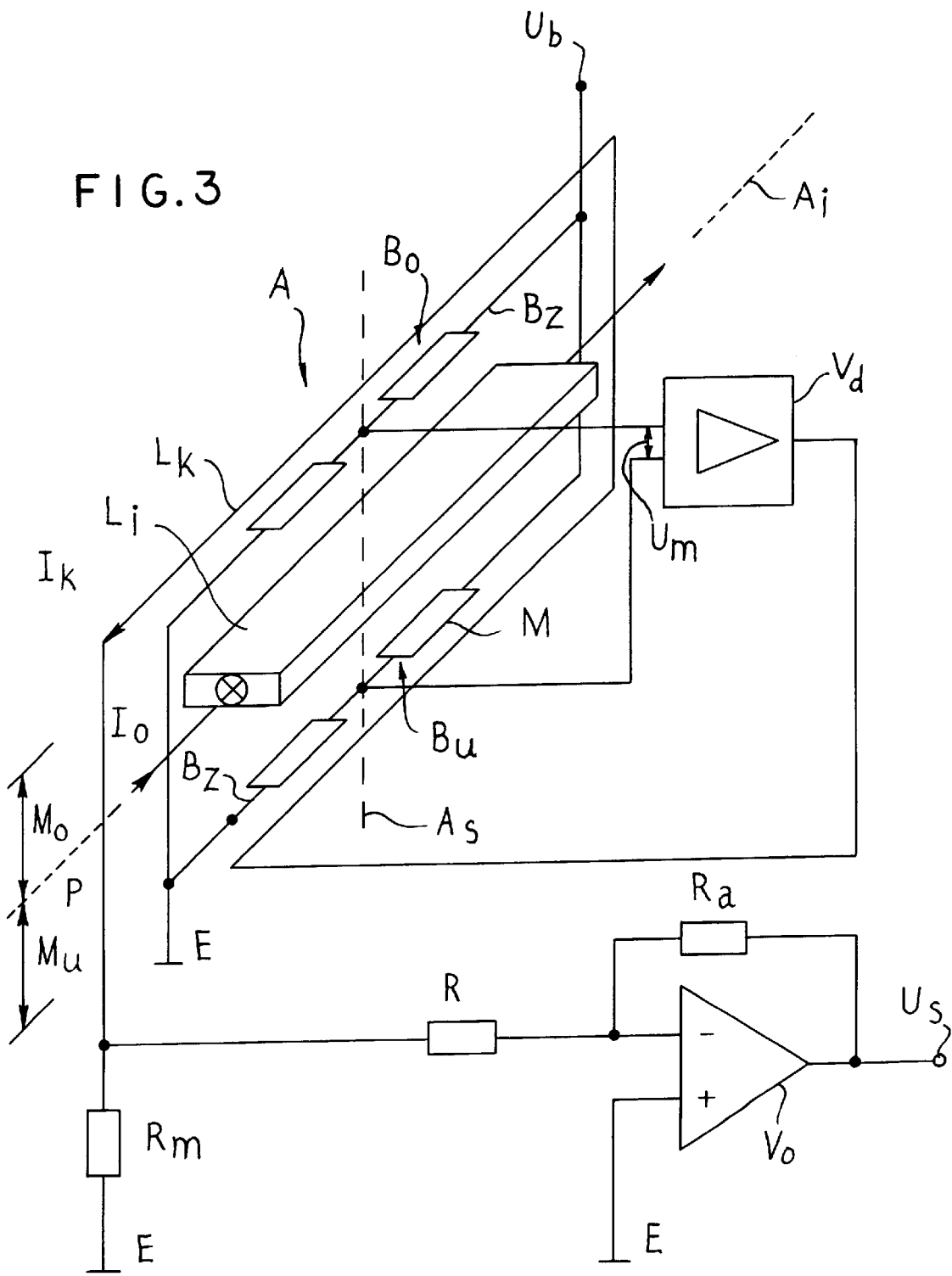
FIG. 3 shows an embodiment with only one measuring bridge.

The significant difference between the embodiment according to FIG. 3 and the devices of FIGS. 1 and 2 is that only a single measuring bridge B is employed. The bridge is here arranged such that each bridge half, bridge branch Bz, is arranged on the upper and the bottom side. Since only one measuring bridge is used, only one amplifier Vd is needed. Furthermore, the two compensating currents Ik are no longer needed. The measuring resistors in one bridge branch Bz are arranged in one plane. The bridge branches Bz are arranged essentially surface parallel on both sides of the conductor. This arrangement is also such that homogeneous interference fields are suppressed and the arrangement is insensitive to uneven distances of the bridge halves from the current conductor. The advantage of this arrangement consists also in the omission of a differential amplifier and of the summation circuit. Furthermore, the sensor chip can be smaller in size.

Figure 4:
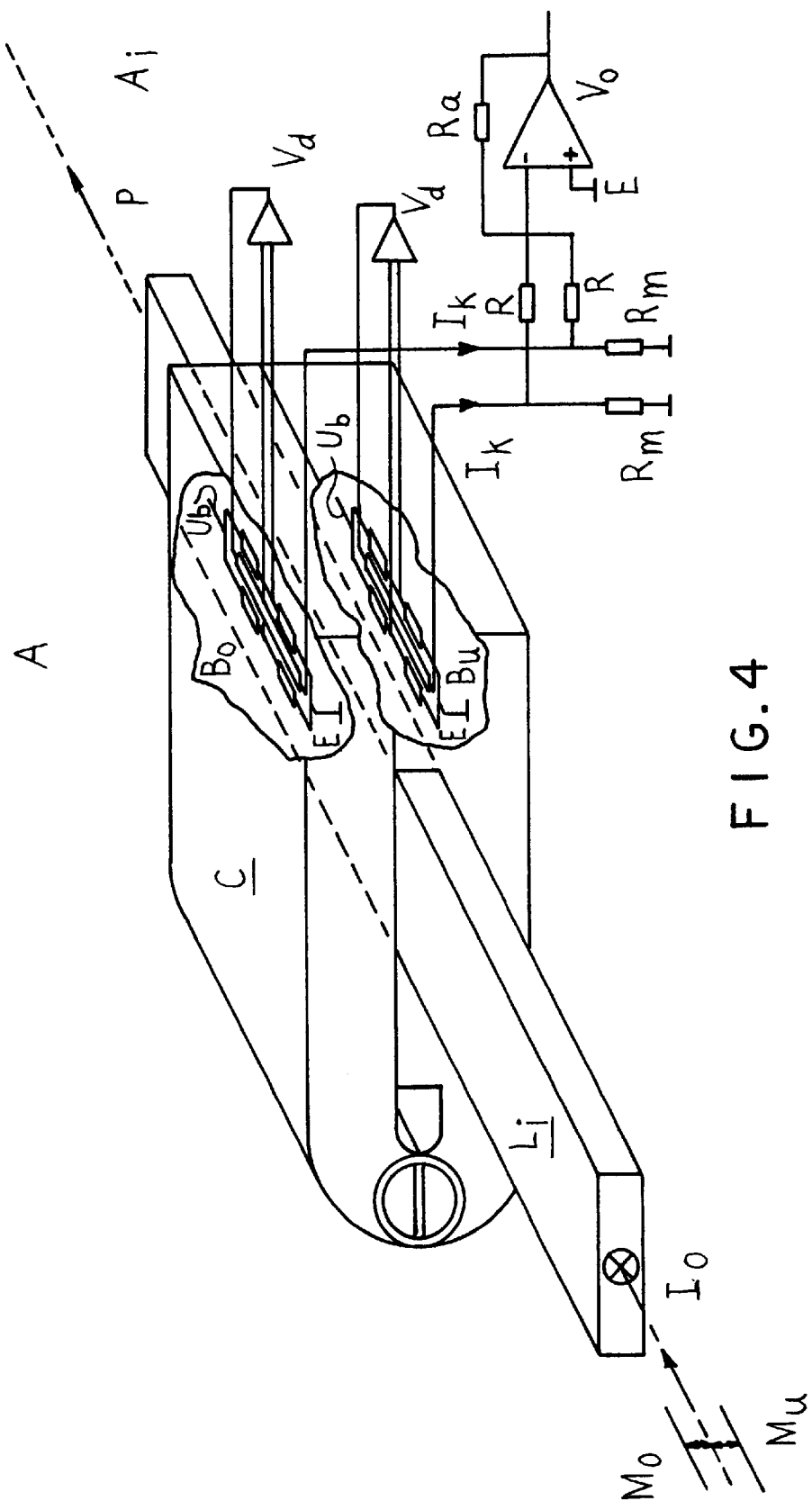
FIG. 4 is a diagrammatic illustration of how the measuring bridges may be placed in a clamping device.
Figure 5:
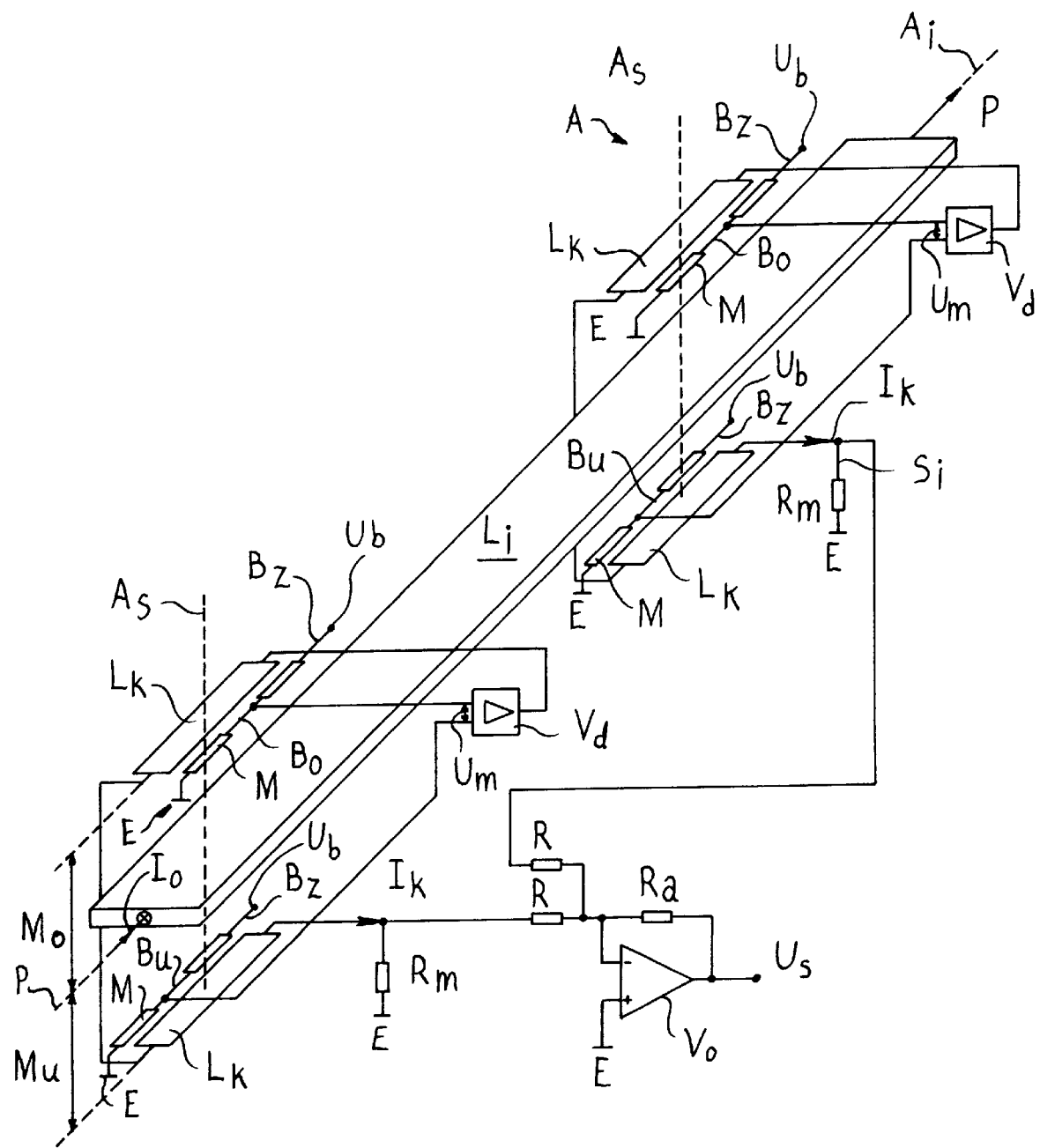
FIG. 5 shows a schematic circuit diagram of the measuring device wherein there are plural measuring bridges on the opposed top and bottom sides of the conductor.

FIG. 4 illustrates how the measuring bridges Bo, Bu can be housed in a clamping device C. Clamping device C is placed around current conductor Li to measure current flow through conductor Li. FIG. 5 illustrates a version of the measuring device wherein multiple measuring bridges Bo, Bu are positioned over opposed sides of current conductor Li.

List of Reference Numerals

A Measuring component
Ai Longitudinal axis
As Axis of symmetry
B, Bo, Bu Measuring bridge
Bz Bridge branch
C Clamping Device
E Zero potential
Im Measuring current
Io Current
Ik Compensating current
Li Current conductor
Lk Compensating line
Mo, Mu Distance
P Direction arrow
Rm Measuring resistor
Ra Balancing resistance
U Bridge voltage
Um Measuring voltage
Us Output voltage
Vd Differential amplifier
Vo Operational amplifier
Z Surroundings The embodiments of the invention in which an exclusive property or privilege is claimed are defined as follows:

1. A measuring device for measuring an electric current flowing through a current conductor with an electric circuit comprising a measuring component in the form of a measuring bridge of magnetoresistive measuring resistors wherein the measuring bridge is constructed as a Wheatstone bridge, to which an electric bridge voltage is applied and from which is tapped a measured voltage representative of the strength of the magnetic field produced by the current in the direct vicinity of the current conductor whereby the measured voltage of the measuring bridge regulates a current source that produces a compensating current as a function of the measured voltage to compensate for the magnetic field of the electric current as measured by the measuring component wherein said measuring component includes:

(a) two parallel connected measuring bridges subjected to the electric bridge voltage are provided as the measuring component wherein each measuring bridge consists of four magnetoresistive measuring resistors;

(b) the measuring resistors for each measuring bridge are arranged in a common bridge plane:

(c) the bridge planes are essentially surface parallel to one another, and are located on opposed sides of the current conductor; and (d) each measuring bridge has a compensating conductor through which the compensating current from an associated one of the current sources flows and the sum of the compensating currents through the compensating conductors is proportional to the current flowing through the current conductor.

2. The measuring device according to claim 1, wherein a measuring resistor is connected to each compensating conductor, the voltage across each measuring resistor is fed to adder, the output signal of the adder is proportional to the current flowing through the current conductor.

3. The measuring device according to claim 1, wherein the current sources are differential amplifiers and the measured voltage of each measuring bridge is applied to a separate one of the differential amplifiers which produces the compensating current as a function of the measured voltage.

4. The measuring device according to claim 1, wherein the measuring bridges are located above and below the current conductor or on horizontally opposed sides of the current conductor.

5. The measuring device according to claim 4, wherein the measuring bridges are arranged around a common lateral axis of symmetry.

6. The measuring device according to claim 4, wherein each measuring bridge and associated current conductor are aligned horizontally and the measuring bridges are spaced a distance to the right and left from the longitudinal axis of the current conductor.

7. The measuring device according to claim 1, wherein the distances between the bridge planes of the measuring bridges can be adjusted.

8. The measuring device according to claim 1, wherein the distances between the longitudinal axis of the current conductor and the bridge planes of the measuring bridges are identical.

9. The measuring device according to claim 1, wherein the number of the measuring bridges arranged at the top and bottom is multiplied.

10. The measuring device according to claim 1, wherein additional measuring bridges are arranged on the sides of the current conductor.

11. The measuring device according to claim 1, wherein each measuring bridge and the associated compensating conductor are stored in a sensor, and the two sensors are provided in a common clamping device, which can be placed over the current conductor.

12. A device for measuring an electric current flowing through a current conductor, the device including a measuring assembly formed out of a plurality of magnetoresistive resistors that are constructed to form a Wheatstone bridge wherein a bridge voltage is applied to the Wheatstone bridge and a measured voltage is produced by the Wheatstone bridge that is representative of the magnetic field of the current in the vicinity of the current conductor and wherein the measured voltage regulates a current source that produces a compensating current as a function of the measured voltage such that the compensating current is proportional to the current being measured, the improvement wherein:

the Wheatstone bridge is constructed out of two bridge halves wherein the bridge halves are positioned to be located on opposed sides of the current conductor;

the magnetoresistive resistors forming each bridge halve are aligned in a common bridge plane;

the bridge planes are parallel aligned with each other and are positioned on opposed sides of the current conductor; and a compensating conductor through which the compensation current from the current source flows is positioned adjacent both said bridge halves.

13. The measuring device according to claim 12, wherein a measuring resistor is connected to the compensating conductor and the voltage across the measuring resistor is proportional to the current flowing through the current conductor.

14. The measuring device according to claim 12, wherein: the current source is a differential amplifier; the voltage present at a junction of the magnetoresistive resistors that form a first one of the bridge halves is applied to a first input of the differential amplifier; the voltage present at junction of the magnetoresistive resistors that form a second one of the bridge halves is applied to a second input of the differential amplifier; and the differential amplifier produces as an output the compensating current that flows through the compensating conductor.

15. The measuring device according to claim 12, wherein the measuring bridge halves are located either vertically above and below the current conductor or on horizontally opposed sides of the current conductor.

16. The measuring device according to claim 12, wherein the measuring bridge halves are arranged symmetrically around a common lateral axis of symmetry.

17. The measuring device according to claim 12, wherein the measuring bridge halves and the current conductor are arranged horizontally and the measuring bridge halves are at a distance on the right and left from the longitudinal axis of the current conductor.

18. The measuring device according to claim 12, wherein the distances between the bridge planes of the measuring bridge halves can be adjusted.

19. The measuring device according to claim 12, wherein the distances between the longitudinal axis of the current conductor and the bridge planes of the measuring bridge halves are identical.

20. The measuring device according to claim 12, wherein the number of the measuring bridge halves arranged at the top and bottom is greater than one.

21. The measuring device according to claim 12, wherein a plurality of measuring bridge halves are arranged on the sides of the current conductor.

22. The measuring device according to claim 12, wherein each measuring bridge half and an associated segment of the compensating conductor are stored in a sensor, and the two sensors are provided in a common clamping device, which is placed over the current conductor.

* * * * *